US008862788B2

(12) United States Patent
Roohparvar

(10) Patent No.: US 8,862,788 B2
(45) Date of Patent: Oct. 14, 2014

(54) CONFIGURATION FINALIZATION ON FIRST VALID NAND COMMAND

(75) Inventor: Frankie F. Roohparvar, Monte Sereno, CA (US)

(73) Assignee: Micron Technology, Inc., Boise, ID (US)

(*) Notice: Subject to any disclaimer, the term of this patent is extended or adjusted under 35 U.S.C. 154(b) by 18 days.

(21) Appl. No.: 13/353,452

(22) Filed: Jan. 19, 2012

(65) Prior Publication Data

US 2012/0113727 A1 May 10, 2012

Related U.S. Application Data

(62) Division of application No. 11/119,321, filed on Apr. 29, 2005, now Pat. No. 8,103,805.

(51) Int. Cl.
*G06F 3/00* (2006.01)
*G11C 7/20* (2006.01)
*G11C 7/10* (2006.01)

(52) U.S. Cl.
CPC ............... *G11C 7/20* (2013.01); *G11C 7/1045* (2013.01)
USPC .................. 710/8; 710/10; 347/143

(58) Field of Classification Search
USPC ..................... 710/8, 10; 347/143
See application file for complete search history.

(56) References Cited

U.S. PATENT DOCUMENTS

| 5,333,300 | A  | * | 7/1994  | Fandrich ............... 711/103 |
|-----------|----|---|---------|----------------------------------|
| 5,463,336 | A  |   | 10/1995 | Gupta et al.                     |
| 5,469,553 | A  |   | 11/1995 | Patrick                          |
| 5,809,312 | A  |   | 9/1998  | Ansel et al.                     |
| 5,894,446 | A  |   | 4/1999  | Itou                             |
| 6,084,803 | A  |   | 7/2000  | Sredanovic et al.                |
| 6,263,399 | B1 |   | 7/2001  | Hwang                            |
| 6,304,114 | B1 |   | 10/2001 | Hirakawa                         |
| 6,393,527 | B1 |   | 5/2002  | Rao et al.                       |
| 6,744,274 | B1 | * | 6/2004  | Arnold et al. ........... 326/16  |
| 6,825,701 | B2 |   | 11/2004 | Akiyoshi                         |
| 6,882,570 | B2 |   | 4/2005  | Byeon et al.                     |
| 6,901,018 | B2 | * | 5/2005  | Bae et al. .............. 365/203 |
| 6,924,676 | B2 |   | 8/2005  | Marotta                          |
| 6,943,596 | B2 |   | 9/2005  | Slamowitz et al.                 |
| 2003/0016074 | A1 |   | 1/2003 | Yung                             |
| 2003/0023840 | A1 | * | 1/2003 | Zitlaw et al. ............ 713/1  |

FOREIGN PATENT DOCUMENTS

EP 0 961 283 A2 12/1999
JP 2000030446 1/2000

* cited by examiner

*Primary Examiner* — Zachary K Huson
(74) *Attorney, Agent, or Firm* — Dicke, Billig, & Czaja, PLLC

(57) ABSTRACT

A startup method and circuit to allow high current consumption for startup processes of a low operating voltage memory device such as a NAND device until the receipt of a valid command to the memory device. Upon receipt of a valid command, startup functions are ceased at the high current consumption, and normal operation begins without the need for using an unreliable low voltage power on reset circuit.

22 Claims, 3 Drawing Sheets

CONFIGURATION FINALIZATION ON FIRST VALID NAND COMMAND

RELATED APPLICATION

This application is a Divisional of U.S. application Ser. No. 11/119,321, titled "CONFIGURATION FINALIZATION ON FIRST VALID NAND COMMAND," filed Apr. 29, 2005 now U.S. Pat. No. 8,103,805, (Allowed) which is commonly assigned and incorporated herein by reference.

FIELD

The present invention relates generally to memories, and in particular the present invention relates to startup configuration of circuits in memories.

BACKGROUND

NAND devices are becoming more and more popular, and are starting to enter the embedded arena. That is expanding the range of voltage operation in such circuits from a typical 3 Volt range toward the 1.8 Volt range. For that region of operation, a Power On Reset (POR) circuit, which resets all circuits before the integrated circuit or NAND device begins to operate, has to fire at much lower voltages. Due to variation of process and temperature, the trip point of these circuits varies significantly, in some cases reaching the range of approximately 1 Volt. This is very low for reliable operation of memory circuits. Many configuration registers and other components need to be set at power up, including for example only and not by way of limitation redundant fuses, other functional fuses, or pins that need to be detected at power up that change the way the device communicates with the outside world.

The reading of fuses is at further risk because the current consumption of these types of memory devices is very low. In some cases, the current consumption is below one microampere. To read or configure such circuitry at very low voltages with very low currents is at best unreliable, and may cause many potential problems.

One of the problems with NAND devices is that since they have very low power consumption, on average less than one microampere, every or nearly every circuit must be shut off when they are not required for operations. Further, a problem with junction leakage exists. Having every circuit shut off is a problem because certain circuit elements, nodes, and devices require preconditioning before operation.

Several areas of difficulty are encountered in typical circuitry. Internal fuses are one. In many cases, fuses are read on power up. Internal fuses in a memory are used to set off voltages or other conditions inside the memory. With NOR cell technologies, during power up, circuit components, nodes, and the like are awakened with latches and the like. On power up, or on POR, one side of a latch is pulled down, which flips the latch. Referring to FIG. 1, a latch 100 with POR circuits 102 and program and erase circuitry 104 and 106 is shown. One input to the latch 100 is a program input, and one input to the latch is an erase input. During operation of a memory in which the latch and circuitry of FIG. 1 is used, the circuit of FIG. 1 is acceptable.

However, the POR must be low enough so that it never moves into the operating range of the device. In a circuit in which 1.5 Volts is the lowest Vcc range, this further limits POR voltages since there are inherent process variations and temperature variations of about three to four tenths of a Volt. In order, therefore, to keep POR out of the operating range of voltages, POR must be set around 1 volt. With threshold voltages in devices being high, on the order of 0.8 to 0.9 volts, the POR voltage is very close to the voltages when devices are turning on. Using POR to try to set voltages and configure startup conditions and preconditioning becomes very difficult, because if process margins move even a small amount, the fuses or circuitry may not read.

Other attempts at solving the problems with low operating voltages include eliminating POR altogether, as is shown in FIG. 2. In NAND devices, however, a single cell cannot perform the job since NAND is arranged in blocks. In such a configuration, a mini-array, of say 64 cells that are erase cells (element 202) and 64 cells that are program cells (element 204), are connected to the inputs of a latch 200. If all programming is erase programming, that latch side that drops to 0 should not be impacted. That is, the 64 cells that are erase will pull one side of the latch to 0, and the other side of the latch theoretically goes high, and there should be no current consumption. However, if there is even a slight leakage on any of the cells, a certain amount of current is pulled on one side that rapidly begins to consume the limited current of around 1 microampere.

Another proposal to fix the problems, especially those of FIG. 2, is shown in FIG. 3, in which there are pads 302 and 304 connected to ground through resistors 306 and 308. If nothing is touching the pads, they will both be low. When the pads are stacked, however, some may be connected to Vcc after stacking. If a pad is forced high, leakage problems still exist since a current is induced through the resistor, which once again begins to consume the limited current available.

For the reasons stated above, and for other reasons stated below which will become apparent to those skilled in the art upon reading and understanding the present specification, there is a need in the art for a low current consumption operating NAND configuration.

SUMMARY

The above-mentioned problems with device configuration and other problems are addressed by the present invention and will be understood by reading and studying the following specification.

In one embodiment, a method of configuring a memory device includes beginning a configuration sequence at power up, identifying a first valid command to the memory device, and terminating configuration of the memory device upon the identification of the first valid command.

In another embodiment, a method of initializing a NAND device includes using high current configuration circuitry for start up operations until a valid command is issued, and switching off the high current configuration circuitry when a valid command is issued.

In yet another embodiment, a method of providing extra current to a memory device during start up includes beginning a configuration sequence at power up with a first current consumption level greater than an operating current consumption level, identifying a first valid command to the memory device, terminating configuration of the memory device at the first current consumption level upon the identification of the first valid command, and continuing operation of the memory device with the operating current consumption level.

In still another embodiment, a method of operating a NAND device includes receiving a power up signal at the NAND device, configuring operation of device components at a first, startup current consumption level greater than a second, operating current consumption level, monitoring incoming commands to the NAND device, and configuring operation of the device components at the second operating current consumption level upon receipt of a first valid command to the NAND device.

In another embodiment, a power up configuration circuit for a memory device includes an OR gate connected to command signals for the memory device, and a latch having a first input connected to a power up signal for the memory device, to latch a validate signal at a first logic level on receipt of the power up signal, and a second input connected to an output of the OR gate, to latch the validate signal at a second complementary logic level upon receipt of a first valid command at the OR gate.

In still another embodiment, a memory device includes an array of memory cells, control circuitry to read, write and erase the memory cells, address circuitry to latch address signals provided on address input connections, and a power up configuration circuit connected to start at least one node of the memory device. The power up configuration circuit includes an OR gate connected to the command signals for the memory device, and a latch having a first input connected to a power up signal for the memory device, to latch a validate signal at a first logic level on receipt of the power up signal, and a second input connected to an output of the OR gate, to latch the validate signal at a second complementary logic level upon receipt of a first valid command at the OR gate.

In yet another embodiment, a processing system includes a processor and a memory device coupled to the processor to store data provided by the processor and to provide data to the processor. The memory device includes an array of memory cells, control circuitry to read, write and erase the memory cells, address circuitry to latch address signals provided on address input connections, and a power up configuration circuit connected to start at least one node of the memory device, the power up configuration circuit including an OR gate connected to the command signals for the memory device, and a latch having a first input connected to a power up signal for the memory device, to latch a validate signal at a first logic level on receipt of the power up signal, and a second input connected to an output of the OR gate, to latch the validate signal at a second complementary logic level upon receipt of a first valid command at the OR gate.

Other embodiments are described and claimed.

DETAILED DESCRIPTION

Figure 1:
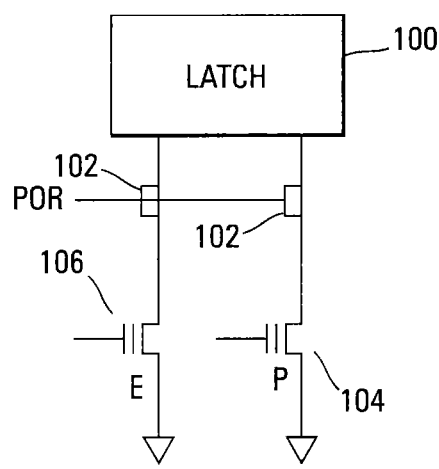
FIG. 1 is a block diagram of a typical power on reset configuration.
Figure 2:
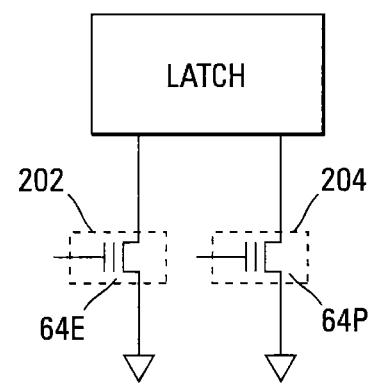
FIG. 2 is a block diagram of a power on reset configuration with blocks of program and erase cells.
Figure 3:
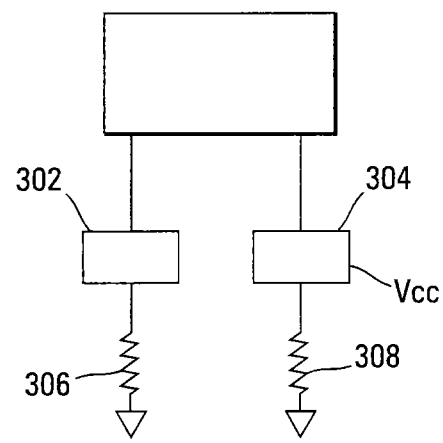
FIG. 3 is a block diagram of a power on reset configuration with pads.

In the following detailed description of the invention, reference is made to the accompanying drawings that form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention.

The following detailed description is, therefore, not to be taken in a limiting sense, and the scope of the present invention is defined only by the appended claims, along with the full scope of equivalents to which such claims are entitled.

The embodiments of the present invention allow high current configuration circuitry to be used at power up, and termination of high current operations of those current consuming circuits upon detection of a first valid command to the system. Current consumption specifications do not specify or typically limit the amount of current available in a startup mode before valid operation begins. Therefore, the current standby specification is not jeopardized by the method and circuit embodiments of the present invention. Advantages of the embodiments of the present invention include more reliable circuit configuration for circuits that need detection upon power up.

The embodiments of the present invention use a first valid command to the circuitry to terminate the configuration of the circuits instead of using a POR signal. This accomplishes two things. First is that valid commands only get issued when voltages are valid, making circuit operations very reliable. Second is that a much higher current can be assigned to such circuits during power up. Then, upon the first valid command, the high current consumption is turned off. The system does not notice the extra current at power up because the specification for current consumption is unspecified for that mode of operation. The currents drawn for high current operations are not too excessive. However, they are set to values higher than currents drawn for normal operations, e.g., one microampere, but not so high as to impact system operation.

On power up of a circuit of the present embodiments, a latch is set to a first logic value (validate). This first logic value of the validate signal is an indication to all circuitry that it can enter startup mode, drawing prescribed currents even in excess of currents available in normal operation. The command lines of the circuit are monitored for any valid command, and upon receipt of any valid command, the latch is set to a complementary logic signal, changing the logic state of the validate signal. When this occurs, the circuitry operating in a startup mode in which it draws excess current is instructed to operate under normal operating current.

There are a number of ways to determine when a valid signal is received. Typical commands into a memory device are multiple cycle commands, with a confirmation. A controller can determine what a valid command is, for example by using knowledge of the form in which a command should appear. For purposes of the embodiments of the present invention, a controller or the like can determine when a valid command is received, and issues a signal indicating a valid command to the power up configuration circuit such as that described below, in the form of a high logic signal. It should be understood that other signals could be used if the logic of the power up configuration circuit is changed, and that such changes are within the scope of the present invention. At this time, since a valid command has been presented, a valid Vcc is also present, and normal operation at low current consumption takes place.

In one embodiment, in order to determine when a valid command is received, all command lines or signals from a controller that are indicative of the signals on the command lines are combined in an OR gate. When the OR gate goes high, indicating a valid command, the validate latch is set to its second logic value, complementary to its first logic value, and the startup circuits that are drawing current in excess of normal operating current conditions are switched to normal operating current conditions or shut off entirely if they are not needed for normal operations. This is done instead of using a POR signal to allow latching in the program and erase cells, and to allow for the consumption of extra current when a limited current consumption is not specified by the specification for current consumption at power up.

Figure 4:
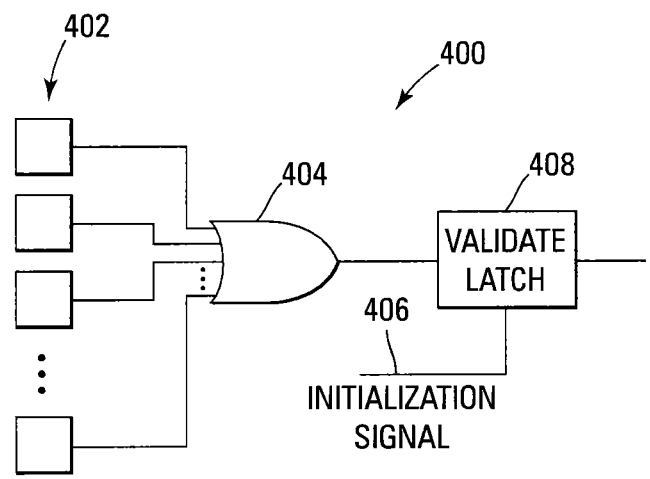
FIG. 4 is a block diagram of a power up configuration according to one embodiment of the present invention.
Figure 4A:
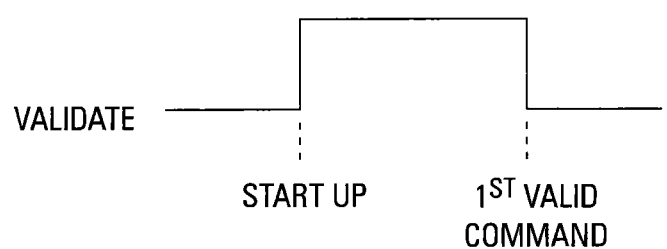
FIG. 4A is a diagram showing the status of a validate signal produced by the embodiment of FIG. 4.

Referring to FIG. 4, a power up configuration according to one embodiment 400 of the present invention is shown. The command lines 402 (or signals indicative of commands on the command lines) of power up configuration 400 are combined in OR gate 404. OR gate 404 and a power up initialization signal 406 are presented to latch 408. At power up, that is, at receipt of the power up signal, the latch 408 is set to its first logic state. This first logic state validate signal from latch 408 is provided to the high current consuming startup circuitry that needs to be preconditioned or started during startup. When a valid command is received, as indicated by the OR gate 404, latch 408 is flipped to switch the validate signal to its second, complementary logic state. When the validate signal goes to its second logic state, the high current consuming startup circuitry is shut off if not needed for normal operation, or switched to low current consumption if used in normal operations, and latching of actual data is begun. The validate signal is provided in various embodiments to control circuitry for a memory, to allow circuits that need preconditioning or other high current operations that it is acceptable to use extra current. Alternatively, the validate signal is provided directly to a startup circuit, which controls startup processes for various components of a circuit such as a memory or the like. FIG. 4A shows the status of a validate signal such as that generated by power up configuration circuit 400 of FIG. 4. In this embodiment, validate signal is latched high when a start up signal is received, and remains high until a first valid command is received. When a first valid command is received, the validate signal drops, and operation under normal operating currents is initiated. It should be understood that any switching between two complementary logic states is an acceptable indication of the receipt of a first valid command, and the use of a different set of logic states is within the scope of one of ordinary skill in the art, and therefore within the scope of the present invention.

Valid commands are only sent when the processing system has determined that valid commands can be sent, typically upon an evaluation of the strength of a supply voltage to the system, or an indication from a POR circuit that a sufficient operating voltage has been reached. Upon receipt of the first valid command, the system is supplying a sufficient supply voltage Vcc, and actual data operations can begin. Until that point, the system is in power up mode, and the current specification does not specify a limit on current draw, that is how much current is consumed, as long as system operation is not impacted by excess current draw, and as long as the power supply is not strained. It is possible to draw on the order of 10 to 20 microamperes of current during the startup operations without impacting circuit operation. The startup circuitry which must start up many components and set certain preconditions therefore can use more current right up until the first valid command is issued.

Therefore, the first time a valid command is received is when the power is truly valid on the system. The controller, having decided that the supply voltage is sufficient and stable, begins sending live commands. Then and only then are latching operations with actual data commenced. Upon receipt of the first valid command, the system is at a sufficient operating voltage, and when the current specification specifies a limit on current consumption, extra current draw is ceased. In this manner, the system does not have to rely on a 1 volt POR circuit, which is unreliable.

Figure 5:
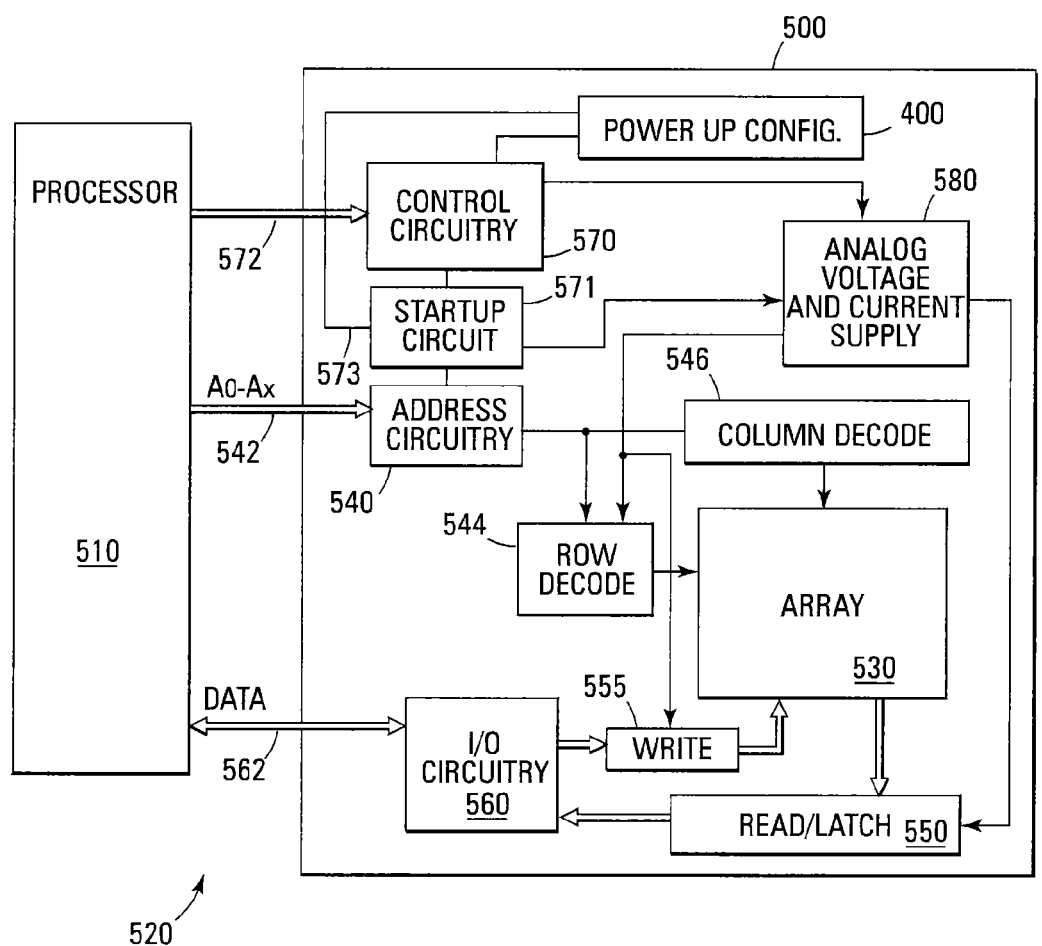
FIG. 5 is a block diagram of a memory device and processor according to another embodiment of the present invention.

FIG. 5 is a functional block diagram of a memory device 500, such as a flash memory device, of one embodiment of the present invention, which is coupled to a processor 510. The memory device 500 and the processor 510 may form part of an electronic system 520. The memory device 500 has been simplified to focus on features of the memory that are helpful in understanding the present invention. The memory device includes an array of memory cells 530. The memory array 530 is arranged in banks of rows and columns.

An address buffer circuit 540 is provided to latch address signals provided on address input connections A0-Ax 542. Address signals are received and decoded by row decoder 544 and a column decoder 546 to access the memory array 530. It will be appreciated by those skilled in the art, with the benefit of the present description, that the number of address input connections depends upon the density and architecture of the memory array. That is, the number of addresses increases with both increased memory cell counts and increased bank and block counts.

The memory device reads data in the array 530 by sensing voltage or current changes in the memory array columns using sense/latch circuitry 550. The sense/latch circuitry, in one embodiment, is coupled to read and latch a row of data from the memory array. Data input and output buffer circuitry 560 is included for bi-directional data communication over a plurality of data (DQ) connections 562 with the processor 510, and is connected to write circuitry 555 and read/latch circuitry 550 for performing read and write operations on the memory 500.

Command control circuit 570 decodes signals provided on control connections 572 from the processor 510. These signals are used to control the operations on the memory array 530, including data read, data write, and erase operations. An analog voltage and current supply 580 is connected to control circuitry 570, row decoder 544, write circuitry 555, and read/latch circuitry 550. In a flash memory device, analog voltage and current supply 580 is important due to the high internal voltages necessary to operate a flash memory. The flash memory device has been simplified to facilitate a basic understanding of the features of the memory. A more detailed understanding of internal circuitry and functions of flash memories are known to those skilled in the art.

A startup circuit 571 is shown connected to control circuitry 570, address circuitry 540, and analog voltage and current supply 580. The startup circuit 571 is used in various embodiments in a memory device and in a processing system including processor 510, to startup various nodes of the circuitry within the memory device or the system. It should be understood that any circuit or node in such a memory device or processing system that needs to be started may be started with the embodiments of the present invention, and that while not all connections are shown, such connections and use of the startup circuit embodiments of the present invention are within its scope. It should also be understood that while a generic memory device is shown, the startup circuit embodiments of the present invention are amenable to use with many integrated circuits as well as with other memory devices, including but not limited to dynamic random access memory (DRAM), synchronous DRAM, flash memory, and the like.

A power up configuration circuit such as circuit 400 shown in FIG. 4 is connected to the startup circuit 571 to provide its validate signal to startup circuit 571. Power up configuration circuit is also connected to receive indications from command lines 572 through control circuitry 570. When a power up signal is received from the processor or the control circuitry generates a power up signal, it is provided to power up configuration circuit 400, which operates as described above to initiate power up operations at higher currents than normal operating current by sending its validate signal to startup circuit 571 along line 573. Power up configuration circuit 400 monitors the commands received through control circuitry 570, and upon receipt of the first valid command, sends its validate signal along line 573. Alternatively, the validate signal is provided through control circuitry 570, which issues commands to startup circuit 571 and to the remaining system components according to the status of the validate signal from power up configuration circuit 400.

CONCLUSION

Methods and circuits for power up configuration have been described that include using extra power on power up to configure a memory device until a valid command is received. The embodiments of the present invention monitor received commands, and allow for higher than operating current consumption during power up until a valid command is received.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A method of initializing a NAND device, comprising:
    using high current configuration circuitry for start up operations until a first valid command is issued; and
    switching off the high current configuration circuitry immediately when the first valid command is issued.
2. The method of claim 1, and further comprising determining when a valid command is issued by combining command signals in an OR gate.
3. The method of claim 1, and further comprising:
    setting a validate signal to a first logic level when high current consumption is acceptable; and
    setting the validate signal at a second, complementary logic level when high current consumption is unacceptable.
4. The method of claim 3, and further comprising:
    using a latch to provide the validate signal.
5. The method of claim 3, wherein the validate signal is set to either the first logic level of the second logic level in response to output from an OR circuit combining command signals to the memory.
6. The method of claim 1, and further comprising determining when a valid command is issued using a controller.
7. The method of claim 6, wherein the controller sets a validate signal to a first logic level on start-up, and wherein the controller sets the validate signal at a second, complementary logic level when the controller determines that a valid command has been issued.
8. A method of providing extra current to a memory device during start up, comprising:
    beginning a configuration sequence at power up with a first current consumption level greater than an operating current consumption level;
    identifying a first valid command to the memory device;
    terminating configuration of the memory device at the first current consumption level immediately upon the identification of the first valid command; and
    continuing operation of the memory device with the operating current consumption level.
9. The method of claim 8, wherein identifying a first valid command comprises:
    combining all command lines in an OR circuit; and
    monitoring the OR circuit for a valid command from any of a plurality of commands.
10. The method of claim 9, and further comprising:
    issuing a validate signal when the first current consumption is acceptable; and
    terminating the validate signal when the first current consumption is unacceptable.
11. A method of operating a NAND device, comprising:
    receiving a power up signal at the NAND device;
    configuring operation of device components at a first, startup current consumption level greater than a second, operating current consumption level;
    monitoring incoming commands to the NAND device; and
    configuring operation of the device components at the second operating current consumption level immediately upon receipt of a first valid command to the NAND device.
12. The method of claim 11, wherein identifying a first valid command comprises:
    combining all incoming commands in an OR circuit; and
    monitoring the OR circuit for a valid command from any of the incoming commands.
13. The method of claim 11, wherein configuring operation of the device components at a first current consumption level comprises setting a latch at a first logic level upon receipt of the power up signal.
14. The method of claim 13, wherein configuring operation of the device components at the second operating current consumption level comprises setting the latch to a second, complementary logic level upon receipt of the first valid command.
15. A method of initializing a NAND memory device, comprising:
    latching a validate signal at a first logic level into a latch on receipt of an initialization signal;
    operating memory device components at a first high current consumption level in response to the validate signal at the first logic level;
    monitoring all incoming command lines to the memory device for a valid command;
    latching the validate signal at a second complementary logic level into the latch immediately upon receipt of a valid command; and
    operating memory device components at a second operating current consumption level in response to the validate signal at the second logic level.
16. The method of claim 15, wherein monitoring all incoming command lines comprises:
    combining all incoming command lines in an OR gate.
17. A power up configuration circuit for a memory device, comprising:
    an OR gate connected to a plurality of command signals for the memory device; and
    a latch having a first input connected to a power up signal for the memory device, to latch a validate signal at a first logic level on receipt of the power up signal, and a second input connected to an output of the OR gate, to latch the validate signal at a second complementary logic level immediately upon receipt of a first valid command at the OR gate.

18. The power up configuration circuit of claim 17, and further comprising:
control circuitry to monitor the latch output to allow the drawing of extra current in the memory device when the validate signal is at the first logic, level.

19. A memory device, comprising:
an array of memory cells;
control circuitry to read, write and erase the memory cells;
address circuitry to latch address signals provided on address input connections; and
a power up configuration circuit connected to start at least one node of the memory device, the power up configuration circuit comprising:
an OR gate connected to a plurality of command signals for the memory device; and
a latch having a first input connected to a power up signal for the memory device, to latch a validate signal at a first logic level on receipt of the power up signal; and
a second input connected to an output of the OR gate, to latch the validate signal at a second complementary logic level immediately upon receipt of a first valid command at the OR gate.

20. The memory device of claim 19, wherein the memory device is a NAND memory device.

21. A processing system, comprising:
a processor; and
a memory device coupled to the processor to store data provided by the processor and to provide data to the processor, the memory comprising:
an array of memory cells;
control circuitry to read, write and erase the memory cells;
address circuitry to latch address signals provided on address input connections; and
a power up configuration circuit connected to start at least one node of the memory device, the power up configuration circuit comprising:
an OR gate connected to a plurality of command signals for the memory device; and
a latch having a first input connected to a power up signal for the memory device, to latch a validate signal at a first logic level on receipt of the power up signal; and
a second input connected to an output of the OR gate, to latch the validate signal at a second complementary logic level immediately upon receipt of a first valid command at the OR gate.

22. The processing system of claim 21, wherein the memory device is a NAND device.

\* \* \* \* \*

UNITED STATES PATENT AND TRADEMARK OFFICE
CERTIFICATE OF CORRECTION

PATENT NO. : 8,862,788 B2
APPLICATION NO. : 13/353452
DATED : October 14, 2014
INVENTOR(S) : Frankie F. Roohparvar Page 1 of 1

It is certified that error appears in the above-identified patent and that said Letters Patent is hereby corrected as shown below:

In the Claims

In column 9, line 8, in Claim 18, delete "logic," and insert -- logic --, therefor.

Signed and Sealed this
Thirtieth Day of December, 2014

Michelle K. Lee
*Deputy Director of the United States Patent and Trademark Office*